United States Patent
Lienau

(10) Patent No.: US 7,463,058 B2
(45) Date of Patent: *Dec. 9, 2008

(54) PROGRAMMABLE ARRAY LOGIC CIRCUIT EMPLOYING NON-VOLATILE FERROMAGNETIC MEMORY CELLS

(75) Inventor: Richard M. Lienau, Pecos, NM (US)

(73) Assignees: Estancia Limited (TC); Pageant Technologies, Inc., Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/889,908

(22) Filed: Aug. 17, 2007

(65) Prior Publication Data

US 2007/0285127 A1 Dec. 13, 2007

Related U.S. Application Data

(60) Continuation of application No. 11/580,064, filed on Oct. 13, 2006, now Pat. No. 7,285,983, which is a continuation of application No. 11/037,696, filed on Jan. 18, 2005, now Pat. No. 7,123,050, which is a division of application No. 10/239,133, filed as application No. PCT/US01/01793 on Jan. 20, 2001, now Pat. No. 6,864,711.

(60) Provisional application No. 60/177,533, filed on Jan. 21, 2000.

(51) Int. Cl.
*H03K 19/177* (2006.01)

(52) U.S. Cl. .......................................... 326/38; 326/41

(58) Field of Classification Search ............. 326/37–41, 326/46
See application file for complete search history.

(56) References Cited

U.S. PATENT DOCUMENTS

| | | | |
|---|---|---|---|
| 4,791,604 A | 12/1988 | Lienau et al. |
| 4,845,633 A | 7/1989 | Furtek |
| 5,295,097 A | 3/1994 | Lienau |
| 5,329,486 A | 7/1994 | Lage |
| 5,436,576 A | 7/1995 | Hibdon et al. |
| 5,712,578 A | 1/1998 | Conley |
| 5,986,465 A | 11/1999 | Mendel |

(Continued)

*Primary Examiner*—Don P Le
(74) *Attorney, Agent, or Firm*—Morgan Lewis & Bockius, LLP

(57) ABSTRACT

A programmable array logic circuit whose temporary memory circuitry employs single bit non-volatile ferromagnetic memory cells. The ferromagnetic memory cells or bits store data even when there is no power provided to the circuitry, thus saving power during operation of the programmable logic circuitry, and ensuring that there is no loss of the data should there be a temporary power shut down. Additionally, the ferromagnetic cells provide for indefinite number of switching actions on the data without degradation to the capacity to store data therein. The invention provides an integrated circuit, comprising a programmable logic circuit array having product lines and input lines therein, and a storage register circuit. The storage register circuit has a ferromagnetic bit and sensor coupled to store a remnant control signal and an output transistor, coupled to be responsive to the remnant control signal on its gate, and coupled between an input and product line. Additionally, the integrated circuit may further include a logical AND array and a logical OR array.

12 Claims, 4 Drawing Sheets

U.S. PATENT DOCUMENTS

| | | |
|---|---|---|
| 6,140,139 A | 10/2000 | Lienau et al. |
| 6,157,979 A | 12/2000 | Barnett |
| 6,229,729 B1 | 5/2001 | Lienau |
| 6,266,267 B1 | 7/2001 | Lienau |
| 6,275,411 B1 * | 8/2001 | Daughton et al. ........... 365/158 |
| 6,288,929 B1 | 9/2001 | Lienau |
| 6,317,354 B1 | 11/2001 | Lienau |
| 6,330,183 B1 | 12/2001 | Lienau |
| 6,341,080 B1 | 1/2002 | Lienau et al. |
| 6,542,000 B1 | 4/2003 | Black et al. |
| 6,545,908 B1 | 4/2003 | Lienau |
| 6,642,744 B2 | 11/2003 | Or-Bach et al. |
| 6,710,624 B2 | 3/2004 | Lienau |
| 6,864,711 B2 | 3/2005 | Lienau |
| 2003/0122578 A1 | 7/2003 | Masui et al. |

* cited by examiner

PROGRAMMABLE ARRAY LOGIC CIRCUIT EMPLOYING NON-VOLATILE FERROMAGNETIC MEMORY CELLS

BACKGROUND OF THE INVENTION

This application is a continuation of co-pending U.S. application Ser. No. 11/580,064, which was filed Oct. 13, 2006, and is allowed, which is a continuation of U.S. application Ser. No. 11/037,696, which was filed on Jan. 18, 2005 and issued as U.S. Pat. No. 7,123,050, which is a divisional of U.S. application Ser. No. 10/239,133, which was filed Sep. 19, 2002 and issued as U.S. Pat. No. 6,864,711, which was a U.S. national phase of International application Number PCT/US01/01793, which was filed Jan. 20, 2001, which claims the benefit of 60/177,533 filed Jan. 21, 2000.

1. The Field of the Invention

The present invention relates generally to a programmable array logic circuit employing non-volatile ferromagnetic memory cells. More particularly, the present invention uses a non-volatile ferromagnetic memory cell to temporarily store binary data.

2. The Background Art

Programmable logic devices have any number product sets, usually in groups of four (4), eight (8), sixteen (16) or more bits, although often in groups often (10). The arrays are programmed for application-specific tasks to be performed within digital electronic circuits. The fusible link types cannot be re-programmed, but those employing EEPROM and Flash can. For those PALs which use fusible links, the data in the "D" registers is lost at power off. For those that use EEPROM and Flash as replacements for the "D" registers, data is not lost at power off time.

Up to the present, traditional PALs have used "D" type flip-flops for product registers. Lately, however, some fabricators have begun using EEPROM and Flash technology to replace these. These last two technologies have draw-backs, however. EEPROMs are cumbersome to re-program, both are slow to re-program, exhibit "write fatigue," thereby limiting their useful life, and must be mass-written to re-program.

SUMMARY OF THE INVENTION

It has been recognized that it would be advantageous to develop a programmable array logic circuit whose temporary memory circuitry employs single bit non-volatile ferromagnetic memory cells.

It is an advantage of the invention to have the ferromagnetic memory cells or bits to store data even when there is no power provided to the circuitry. Thus, saving power during operation of the programmable logic circuitry, and ensuring that there is no loss of the data should there be a temporary power shut down.

Additionally, the ferromagnetic cells provide for indefinite number of switching actions on the data without degradation to the capacity to store data therein.

The invention provides an integrated circuit, comprising a programmable logic circuit array having product lines and input lines therein, and a storage register circuit. The storage register circuit has a ferromagnetic bit and sensor coupled to store a remnant control signal, and an output transistor, coupled to be responsive to the remnant control signal on its gate, and coupled between an input and product line.

Additionally, the integrated circuit may further include a logical AND array and a logical OR array.

Additional features and advantages of the invention will be set forth in the detailed description which follows, taken in conjunction with the accompanying drawing, which together illustrate by way of example, the features of the invention.

DETAILED DESCRIPTION

Figure 1:
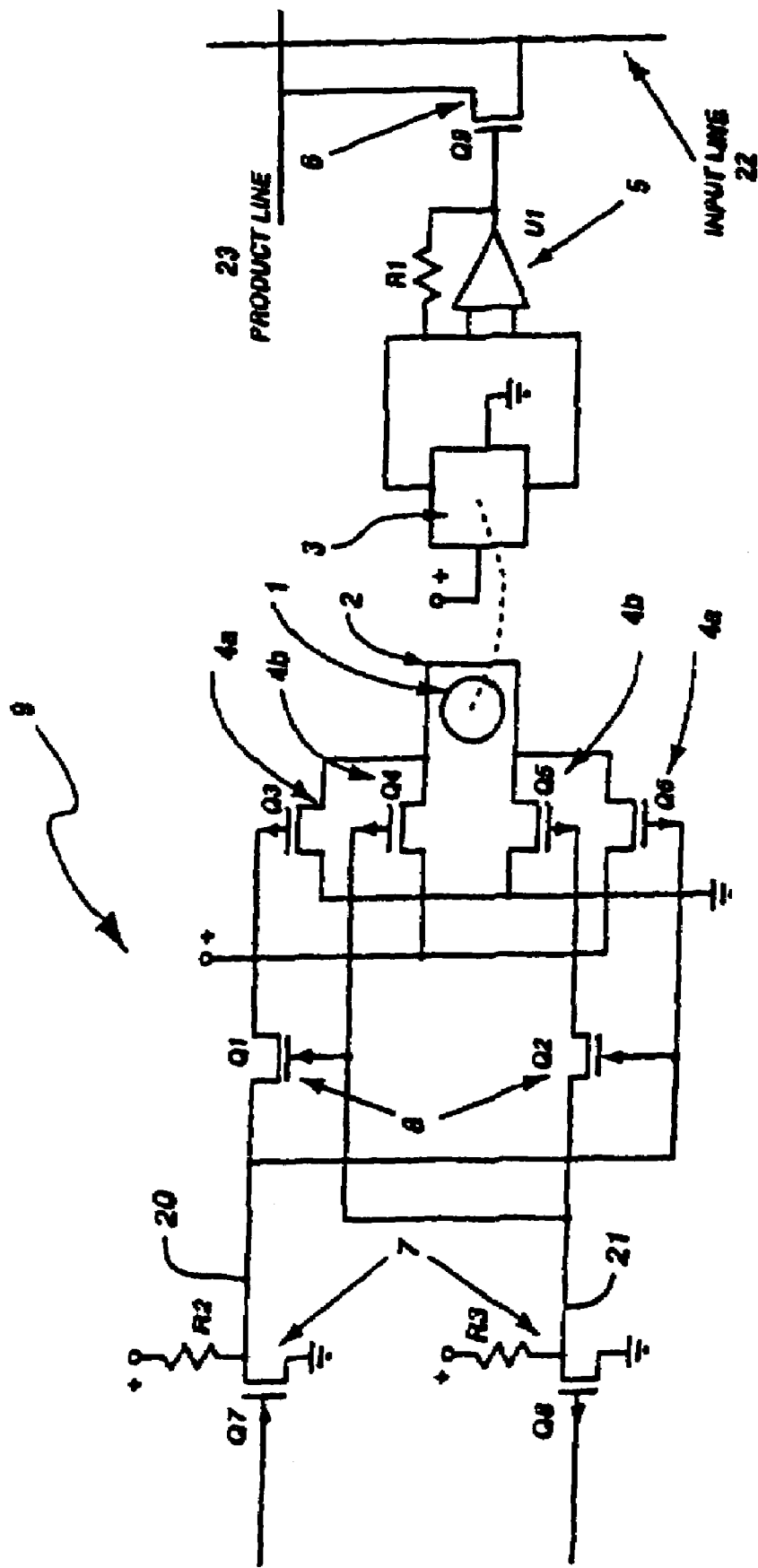
FIG. 1 is a schematic of a preferred embodiment of the present invention.

For the purposes of promoting an understanding of the principles of the invention, reference will now be made to the exemplary embodiments illustrated in the drawings, and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

For the purpose of providing background material which may in some respects illustrate the state of the art, the following books are herein incorporated by reference for non-essential material: "Programmable Logic Handbook," fourth edition, by Monolithic Memories Inc., 2175 Mission College Blvd., Santa Clara, Calif.; and "Practical Design Using Programmable Logic," by D. Pellerin and M. Holley, Prentice Hall, library of Congress no. TK7872.L64 1991.

The following United States patents are herein incorporated by reference for their supporting teachings:

U.S. Pat. No. 5,300,830, is a programmable logic device macrocell with an exclusive feedback and exclusive external input lines for registered and combinatorial modes using a dedicated product term for control.

U.S. Pat. No. 5,287,017, is a programmable logic device macrocell with two OR array inputs.

U.S. Pat. No. 5,324,998, is a zero power re-programmable flash cell for a programmable logic device.

U.S. Pat. No. 5,295,097, is a nonvolatile random access memory.

U.S. Pat. No. 5,867,049, is a zero setup time flip flop.

U.S. Pat. No. 5,298,803, is a programmable logic device having low power microcells with selectable registered and combinatorial output signals.

The invention is used in the normal arena in which PALs are employed, but where it may be advantageous to retain the last data stored after removal of power to the circuit as well as the simplicity of random re-programming. This PAL circuit could be in all manner of digital circuitry, including computers, robotics, telephonics, automotive circuits, security devices, and so on. The advantages over prior art lie principally in that PAL devices using ferromagnetic digital memory cells for product registers would enjoy non-volatility, high-speed in situ random re-programmability and indefinite long life span.

A PAL having product registers (flip flops) that use non-volatile ferromagnetic memory/storage cells for product storage registers is described wherein the non-volatile ferromagnetic memory cells, comprised of single stick-like ferromagnets whose aspect ratio is greater than 1:1 (height to width), are fabricated normal to the plane of the substrate with a sensor centered intimate to, and at one end of the ferromagnets are used for these functions. The magnetic polarity of each ferromagnetic memory cell bit is coerced into reversal using write, or state change circuitry, comprised of a coil which surrounds, up to and including 270°, and is intimate to, the ferromagnetic stick. The write current in each coil is bi-directional, depending on the desired magnetic movement, or polarity, of the bit. The output of the sensor reflects the binary condition of the bit, and is used as binary data output for product registers.

FIG. 1 is a schematic of a dual output storage register 9, or flip-flop, which is comprised of a ferromagnetic memory cell consisting of micron or sub-micron-sized ferromagnetic bit whose aspect ratio is greater than 1:1 (i.e., 2:1, etc.), deposited normal to the plane of the substrate with its attendant support circuitry. Uniquely, there is a ferromagnetic stick (bit) 1, which is at least partially, but not necessarily completely, surrounded by a write drive coil 2. The bi-directional current in the write drive coil sets the polarity of the bit and is switched by two sets of transistor pairs, or switches. The first transistor pair being Q3 and Q6, having reference number 4a, and the second pair being Q4 and Q5 having reference number 4b. These switches are in turn gated by Q1 and Q2, having reference number 8, both of which are "on" when either of the SET 25 or RESET 26 lines are inactive, or positive in polarity. Q7 and Q8, reference number 7, are the SET and RESET switches. When one or the other of the SET or RESET lines is appropriately pulsed, the associated gate is opened to allow ground to be coupled to line 20 or 21 and thus pulling them low.

Figure 3:
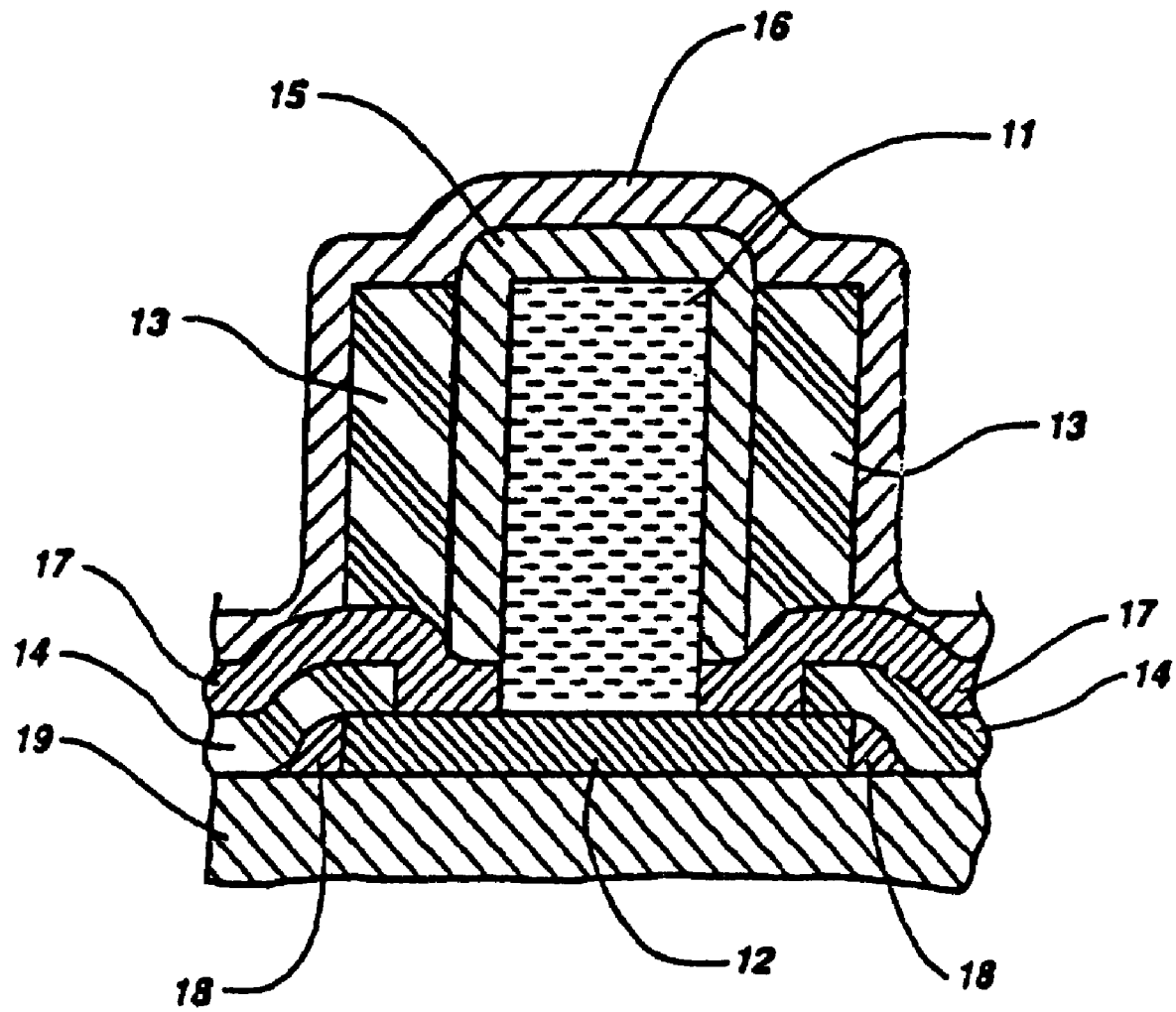
FIG. 3 is a cross sectional view of a single ferromagnetic memory bit.

On a second portion of the flip-flop 9, or storage register circuit, there is a ferromagnetic bit field sensor 3, which is capable of sensing remnant polarity stored in the bit 1. It is noted that the dashed line is meant to illustrate the fact the sensor 3 is to be physically located proximate the top or bottom of the ferromagnetic bit 1, but is illustrated at a spaced relationship for schematic purposes only and not meant to illustrate physical layout as is shown in Figure. 3. Wherein, amplifier U1, having reference number 5, responds to the signal based on the Hall voltage that appears across the sensor 3. The outputs are fed to an output transistor Q9, having reference number 6, which in turn allows input line 22 to be coupled to product line 23 when the output of the storage register 9 opens the gate on the output transistor Q9.

Since the ferromagnetic bit does not change state when power to the circuit is off, when power has thereafter been restored subsequent to a power off, the storage registers will have retained their critical data. Additionally, even while there is power to the programmable logic device, it is noted that additional power is not required to maintain the stored state in the flip-flop 9, thus, saving overall power consumption.

Figure 2:
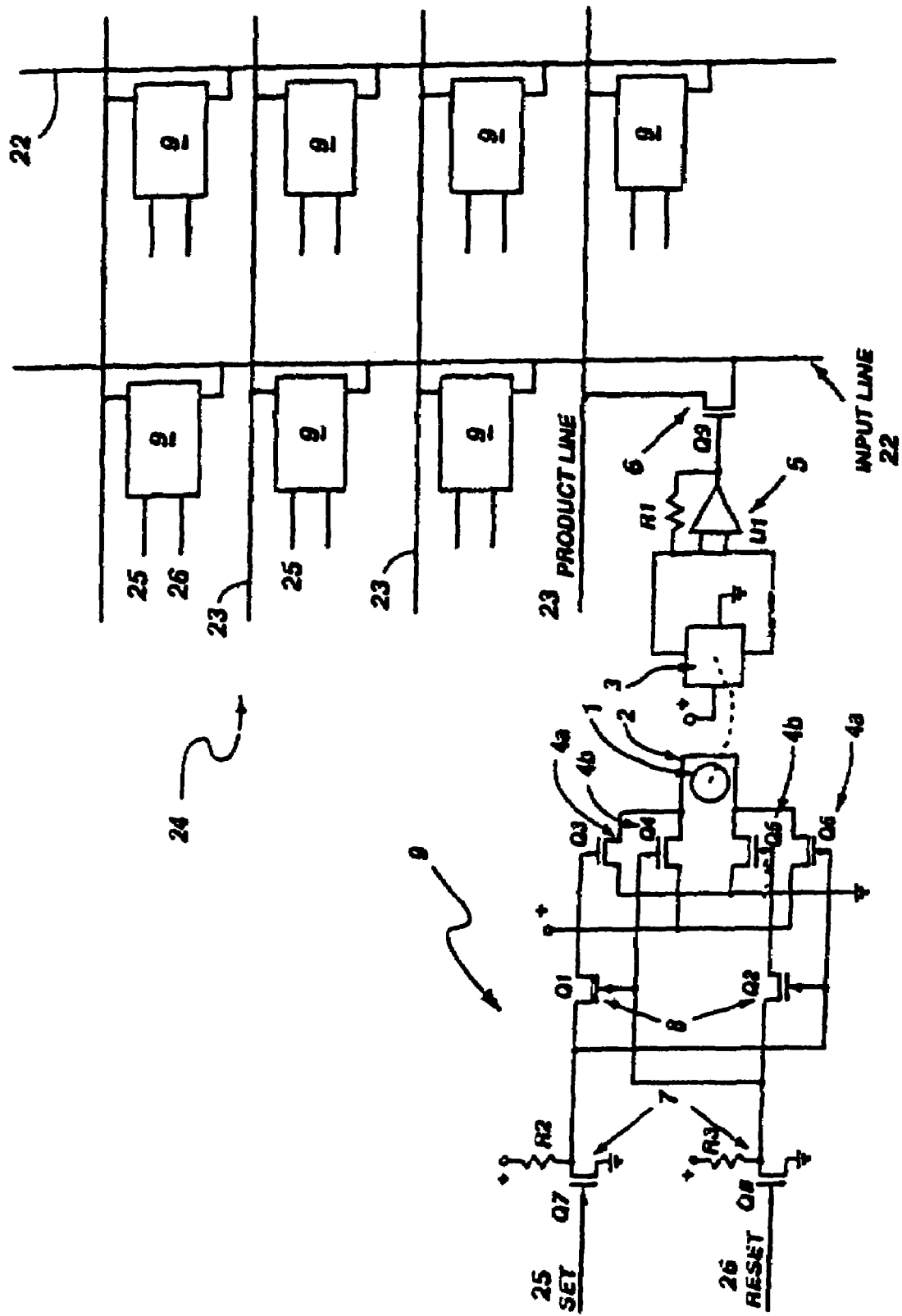
FIG. 2 is a schematic of a preferred embodiment of the present invention.

FIG. 2 is a representation of the "SR" type register or flip-flop 9 of FIG. 1 and is connected to the product circuitry of a typical PAL product array 24. It is noted that one skilled in the art will easily realize that the bit 1 will store a remnant polarity in the material that the sensor 3 will sense. Thus, creating a remnant control signal that will cause the amplifier 5 to constantly open or close the gate of output transistor 6. Where the polarity of the bit will exist even after the power to the circuitry has been turned off. Thus, to read the product line signal, it is only needed to provide power to the amplifier 5. Where to change the remnant polarity, the SET and RESET control circuitry is needed to be activated.

FIG. 3 depicts, for example, a potential cross-section of a micron or sub-micron scale ferromagnetic memory cell with the sensor shown on the bottom; however, the sensor can be on the top as well. There is no functional difference between these configurations. They demonstrate that either construction can be employed. There is a ferromagnetic storage element 11, or "bit," a sensor 12, a sample drive line 14, which is made of Al, Cu or any other suitable conductor material. Additionally there is a cutaway of the set (write) drive coil 13 that wraps around bit 11. In this depiction, matrix interconnects are not shown for the sake of clarity. The entire memory cell rests on substrate 19, which can be silicon, glass, GaAs, or other suitable material. Insulation layer 15 resides between the ferromagnetic bit 11 and the set coil 13. Insulation layer 15 can be of material such as SiO 2or Si3N4, etc. There is an overall insulation section 16, 17 and 18, again made of SiO2or Si3N4, etc. or other suitable material.

It is noted that there are currently several designs that are currently being developed by the current inventive entity regarding the layout of the ferromagnetic bit and its accompanying sensing circuitry that will be functionally equivalent to the circuitry disclosed in FIG. 3.

Several methods may be employed to make this cell, including, but not limited to, electroplating, sputtering, E-beam deposition, chemical vapor deposition and molecular beam epitaxy.

Figure 4:
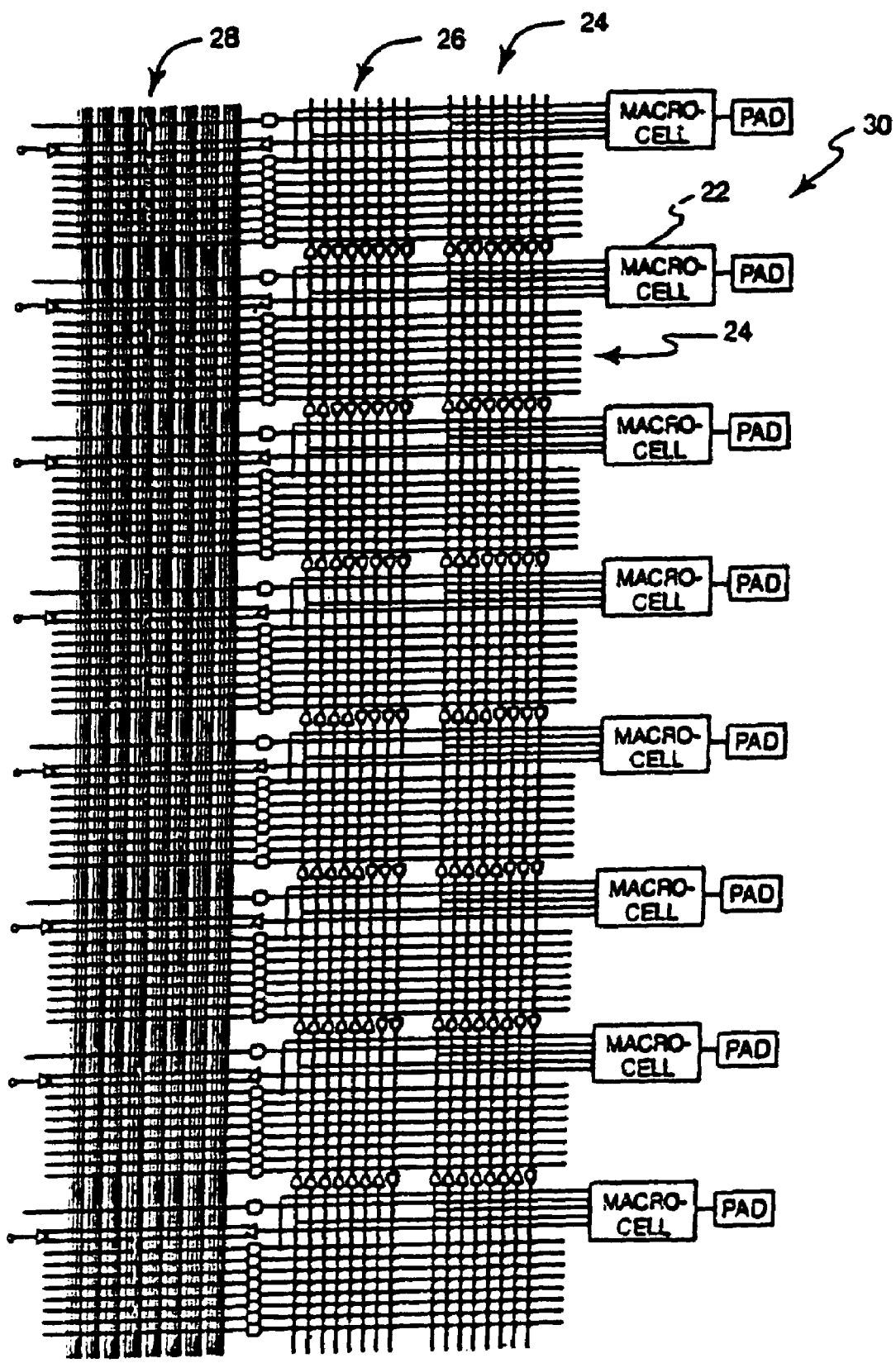
FIG. 4 is a schematic of a field programmable logic device capable of utilizing the present invention.

Referring to FIG. 4, there is an embodiment of the invention being utilized In a field programmable logic device. One skilled in the art will recognize that there is a , Programmable AND array with inputs and outputs. Similarly, there are two programmable OR arrays that route signals through various levels or numbers of logical OR gates before the sum of products are sent to designated macrocells It is noted that the intersections of the AND and OR arrays (the lines) will have one of the flip-flops 9 located thereat to allow for product calculation as illustrated in FIG.2.

It is understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been shown in the drawings and fully described above with particularity and detail in connection with what is presently deemed to be the most practical and preferred embodiment(s) of the invention, it will be apparent to those of ordinary skill in the art that numerous modifications, including, but not limited to, variations in size, materials, shape, form, function and manner of operation, assembly and use may be made, without departing from the principles and concepts of the invention as set forth in the claims.

What is claimed is:

1. A programmable logic array, comprising:
   a) a product line;
   b) an input line; and
   c) a storage register circuit, having:
      i) a ferromagnetic bit coupled to store a remnant control signal;
      ii) a write drive coil; and
      iii) an output switch.

2. The programmable logic array of claim 1, wherein the ferromagnetic bit is at least partially surrounded by the write drive coil to set the polarity of the ferromagnetic bit.

3. The programmable logic array of claim 1, wherein the output switch is coupled to be responsive to the remnant control signal, and coupled between the input line and product line.

4. The programmable logic array of claim 1, wherein the storage register circuit further includes a sensor positioned proximate to the ferromagnetic bit, to sense the polarity of the ferromagnetic bit and to create the remnant control signal therefrom.

5. The programmable logic array of claim 4, wherein the output switch is a transistor having a gate controlled by the remnant control signal.

6. The programmable logic array of claim 4, further comprising a logical AND array.

7. The programmable logic array of claim 4, further comprising a logical OR array.

8. The programmable logic array of claim 4, wherein the ferromagnetic bit has a height that is greater than its width.

9. The programmable logic array of claim 6, wherein the storage register circuit has a supporting substrate to support the ferromagnetic bit to have the height oriented perpendicular thereto.

10. The programmable logic array of claim 7, wherein the sensor is located below the ferromagnetic bit and above the substrate.

11. The programmable logic array of claim 1, wherein the storage register circuit has a set and reset input to program the remnant control signal that is to be stored in the ferromagnetic bit.

12. The programmable logic array of claim 1, wherein the write drive coil is bi-directional.

* * * * *